Feb. 14, 1967 R. E. BURDICK ETAL 3,304,206

THERMOELECTRIC CONVERTER MODULE

Filed May 22, 1961 2 Sheets-Sheet 1

*INVENTORS*
ROBERT E. BURDICK
SOL R. ROCKLIN

*BY* [signature]

ATTORNEY

*INVENTORS*
ROBERT E. BURDICK
SOL R. ROCKLIN

*BY* [signature]

ATTORNEY

United States Patent Office 3,304,206
Patented Feb. 14, 1967

3,304,206
THERMOELECTRIC CONVERTER MODULE
Robert E. Burdick, Chatsworth, and Sol R. Rocklin, Pacific Palisades, Calif., assignors, by mesne assignments, to the United States of America as represented by the United States Atomic Energy Commission
Filed May 22, 1961, Ser. No. 111,573
2 Claims. (Cl. 136—211)

The present invention is directed to a thermoelectric converter and more particularly to a thermoelectric converter module adapted for use in a vacuum.

In the construction of thermoelectric converters for use with nuclear reactors in remote locations or in orbit (see Nucleonics, vol. 18, No. 1, January 1960, p. 103, and vol. 19, No. 4, April 1961, pages 54–100) long-lived, trouble-free operation is essential. The utilization of thermoelectric materials, e.g., zinc-antimony, copper-silver-selenium, copper-silver-tellurium, selenium-sulphur, silver-tellurium, lead-tellurium, etc., creates significant problems because of the physical and chemical characteristics of these materials and their differences from and chemical reactions with ordinary structural materials. Further, the poor mechanical strength and undesirable chemical and physical changes at elevated temperatures impose serious limitations upon the use of thermoelectric materials in high-temperature systems.

It is therefore the principal object of the present invention to provide a thermoelectric assembly particularly adapted for use in a high-temperature system.

It is another object of the present invention to provide a rigidly supported thermoelectric module having sufficient flexibility to accommodate thermal expansion while maintaining rigid heat flow contacts.

A further object of the present invention is to provide a thermoelectric converter module which minimizes thermal impedances and maximizes efficiency.

Another object of the present invention is to provide a thermoelectric converter module in which the mechanical stresses resulting from differential thermal growth between the heat source and the heat sink are relieved.

Another object of the present invention is to provide a thermoelectric converter module in which radiant heat losses from the heat source are minimized and in which the radiation from the heat sink is maximized.

Another object of the present invention is to provide a thermoelectric converter module which has a high resistance to mechanical shock and vibration.

Another object of the present invention is to provide a thermoelectric converter module adapted for operation in a vacuum.

These and other objects and advantages of the present invention will be more apparent from the following detailed description and drawings, made a part hereof, in which.

Figure 1:
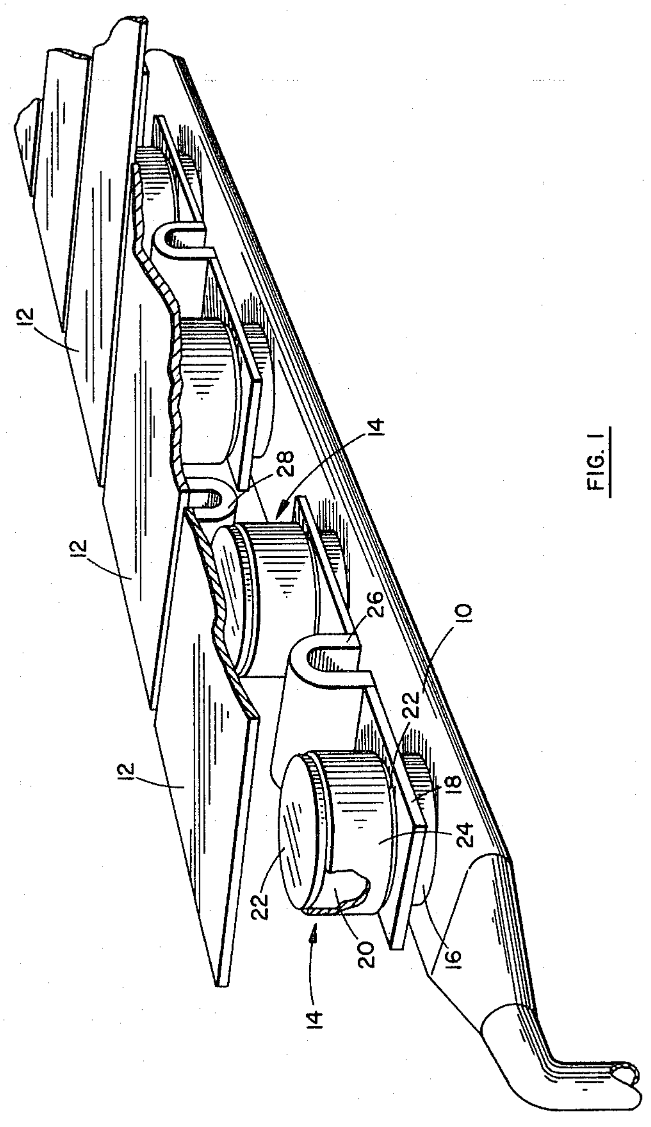
FIGURE 1 is a perspective view of a portion of the device of the present invention.

Referring now to the drawings in detail, the preferred embodiment of the thermoelectric converter module of the present invention comprises duct means 10, preferably of stainless steel, through which a heated fluid flows, e.g., NaK, and a plurality of electrically conductive radiator elements 12. The radiator means 12 is spaced from the duct 10 and a plurality of thermoelectric assemblies, indicated generally at 14, are disposed between the radiator 12 and the duct 10. Each thermoelectric assembly 14 includes a thermally conductive, electrical insulator 16, e.g., BeO metallized with Mo and Ni plated on both sides, an electrical conductor 18, e.g., copper, and a thermoelectric element 20, e.g., lead telluride. The insulator 16 is brazed to the duct 10 and the conductor 18. The lead telluride thermoelectric element 20 of the preferred embodiment has upper and lower caps 22 of iron which act as diffusion barriers to prevent adjacent materials from diffusing into the element 20. An encapsulant 24, e.g., a glass frit coating or a high thermal expansion cement, is used to cover the periphery of element 20 to minimize sublimation at low atmospheric pressures and high temperatures. In this manner the caps 22 and encapsulant 24 completely protect the thermoelectric element from the environment.

The diffusion barriers or caps 22 are pressure welded to the thermoelectric material, while the connections between caps 22 and conductor 18 and radiator 12 are brazed.

Each thermoelectric assembly 14 has an individual radiator 12 and conductor 18. Alternate pairs of conductors 18 are interconnected with an electrical conductor 26 constructed to allow for expansion of the duct 10 in the longitudinal direction. In the preferred embodiment conductor 26 is of copper in a U shape, or fabricated of a conducting braid material, and is brazed to the adjacent pair of conductors 18. Alternate pairs of radiator elements 12 are also interconnected by elements 28 which allow for thermal expansion in the longitudinal direction. In this manner, utilizing alternate P and N type semiconductor thermoelectric assemblies 14 an electrical series connection is made, i.e., an adjacent pair of assemblies 14 are connected by a conductor 26 and the next adjacent assembly 14 is connected through a conductor 28. Thus, the radiator 12 serves both as an electrical conductor and as a heat sink, thereby minimizing the weight of the module. As many assemblies 14 may be utilized as may be desired. In the preferred embodiment twelve such assemblies are used in a module to provide an output of .24 volt, 19 amps with matched load with a two percent efficiency in a vacuum with heat rejection by radiation to space.

The thermoelectric assemblies 14 may also be electrically connected in parallel electrical arrangement, i.e., all of the radiator elements 12 interconnected and all of the electrical conductors 18 interconnected with the proper selection and orientation of the thermoelectric material.

Figure 2:
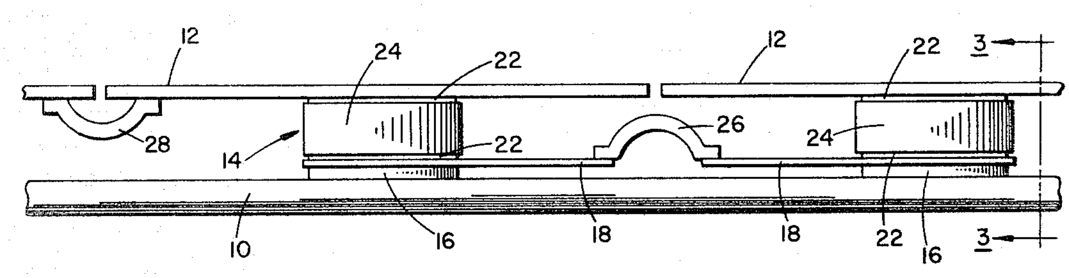
FIGURE 2 is a side view of a portion of the module of the present invention.

The series electrical connections are shown in more detail in FIG. 2. Operation is as follows: The heated fluid passes through duct 10 and heat is conducted through the electrical insulator 16, conductor 18, cap 22, to the radiator 12, where it is radiated to space. The thermoelectric material 20 generates electricity by virtue of the temperature difference created across the material, as is well known in the art. The current output in one assembly is conducted to the input side of the next assembly by the series connection described above. Output connections from each module may be connected directly to a load or may be interconnected in parallel or series electrical fashion with other modules.

Figure 3:
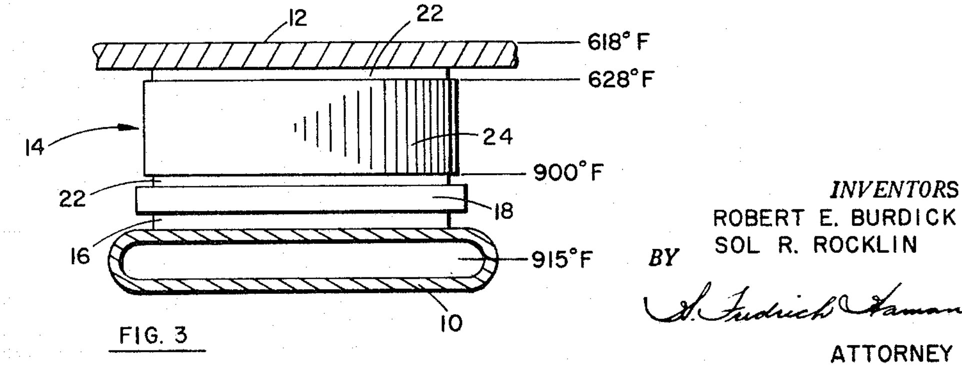
FIGURE 3 is an end view of the module along line 3—3 of FIGURE 2 showing a typical temperature profile.

FIGURE 3 shows a typical temperature profile for the preferred embodiment where the fluid is at a temperature of 915° F. A temperature drop of 15° F. is maintained across the insulator 16, conductor 18, and lower cap 22. A temperature difference of about 275° F. is present across the thermoelectric material 20, while an additional 10° F. drop takes place to the radiator surface.

The duct 10 is preferably coated with a low emissivity material, e.g., silver, to minimize the radiant heat losses. The radiator 12 is preferably coated with a high emissivity material, e.g., electro-deposited chromic oxide or aluminum-titanium oxide, to facilitate radiation of waste heat to the atmosphere.

The module of the present invention provides for rigid construction of each thermoelectric assembly 14 while utilizing flexible connection between adjacent interconnected assemblies, thereby allowing for dimensional growth of the duct 10 during temperature changes without applying shear loads to the thermoelectric materials 20 or the electrical insulator 16. In this manner mechanical stresses resulting from differential thermal growth between the heat source and heat sink are confined to the expansion means provided between each assembly 14. Further, the resistance to mechanical shock and vibration is significantly increased by rigidly supporting each assembly 14 on the duct 10 and flexibly interconnecting the assemblies so that any vibration or oscillation of the duct is not transferred between assemblies and does not affect the structural integrity of the individual assemblies.

Having described a preferred embodiment of the present invention, it is understood that although specific terms and examples are employed, they are used in a generic and descriptive sense and not for the purposes of limitations, since changes and modification will occur to those skilled in the art without departing from the spirit of the invention. For example, other expansion means as well as other materials, diffusion barriers, thermoelectric material, encapsultants, and insulators may be utilized. Further, other geometries, e.g., curved, may be utilized.

What is claimed is:

1. A thermoelectric converter module comprising a plurality of thermoelectric assemblies, each of said assemblies including a semi-metallic thermoelectric material, means encapsulating said material, means for generating an electrical current across said material including a heat source thermally connected to said assemblies and an electrically conducting heat sink thermally and electrically connected to said material, and means for expansibly interconnecting said assemblies in an electrically continuous circuit, said heat source being electrically insulated from said thermoelectric assembly, said heat sink including an individual radiator element for each of said assemblies and said expansible means including electrical connections alternately between adjacent hot junctions and cold junctions to form a serially connected circuit of thermoelectric elements.

2. A thermoelectric module for use in an outer space enviroment for converting heat into electricity comprising a longitudinally extending duct adapted to carry a flowing electrically conducting liquid, a plurality of electrically insulating and thermally conductive elements connected to said duct and located at spaced positions along its length, a conductor element secured to each of said insulator elements in spaced relation with said duct and having a portion extending in a direction parallel with said duct, said portions of adjacent pairs of conductors extending in opposite directions; flexible means electrically interconnecting the ends of said extended portions; thermoelectric means positioned on and having one surface attached to each of said conductors at the ends adjacent said electrical insulating elements; an electrically and thermally conductive radiator element secured to the surface of each of said thermoelectric means opposite said one surface; flexible means electrically interconnecting one end of said radiator element with the adjacent radiator elements, said last-named flexible means being located on the side of said thermoelectric means opposite said first flexible means.

References Cited by the Examiner

UNITED STATES PATENTS

| | | | |
|---|---|---|---|
| 1,848,655 | 3/1932 | Petrik | 136—4.2 |
| 2,811,569 | 10/1957 | Fredrick et al. | 136—4.2 |
| 2,903,857 | 9/1959 | Lindenblad | 136—4.2 |
| 3,006,979 | 10/1961 | Rich | 136—4.2 |
| 3,070,644 | 12/1962 | Van Der Grintem et al. | 136—4 |

WINSTON A. DOUGLAS, *Primary Examiner.*

JOHN H. MACK, JOHN R. SPECK, BENJAMIN R. PADGETT, *Examiners.*

J. BARNEY, D. L. WALTON, *Assistant Examiners.*